United States Patent [19]

Kudo

[11] Patent Number: 4,766,309
[45] Date of Patent: Aug. 23, 1988

[54] AIR FLOW SHIELDING ATTACHMENT FOR USE IN PROJECTION TYPE EXPOSURE APPARATUS

[75] Inventor: Yoshihiko Kudo, Tokyo, Japan

[73] Assignee: Nippon Kogaku K. K., Tokyo, Japan

[21] Appl. No.: 899,863

[22] Filed: Aug. 25, 1986

[30] Foreign Application Priority Data

Aug. 29, 1985 [JP] Japan ................... 60-190253

[51] Int. Cl.[4] .............................. H01J 40/14
[52] U.S. Cl. ......................... 250/237 R; 250/548
[58] Field of Search .......... 250/548, 557, 561, 237 R, 250/239; 356/399, 400, 401; 364/490, 491, 559

[56] References Cited

U.S. PATENT DOCUMENTS

| 4,506,977 | 3/1985 | Sato et al. | 356/399 |
| 4,531,060 | 7/1985 | Suwa et al. | 356/400 |
| 4,561,773 | 12/1985 | Sato | 356/400 |
| 4,608,494 | 8/1986 | Kobayashi et al. | 356/400 |

Primary Examiner—David C. Nelms
Assistant Examiner—Jessie Ruoff
Attorney, Agent, or Firm—Shapiro and Shapiro

[57] ABSTRACT

A projection type exposure apparatus for projecting an original pattern formed on a mask onto a substrate, which comprises a projection optical system, a lens tube member for holding the projection optical system, an alignment optical system and a battle wall member disposed along the path of the projection light beam in the space between the mask and the projection optical system for shutting the space from the flow of external air.

7 Claims, 2 Drawing Sheets

F I G.1
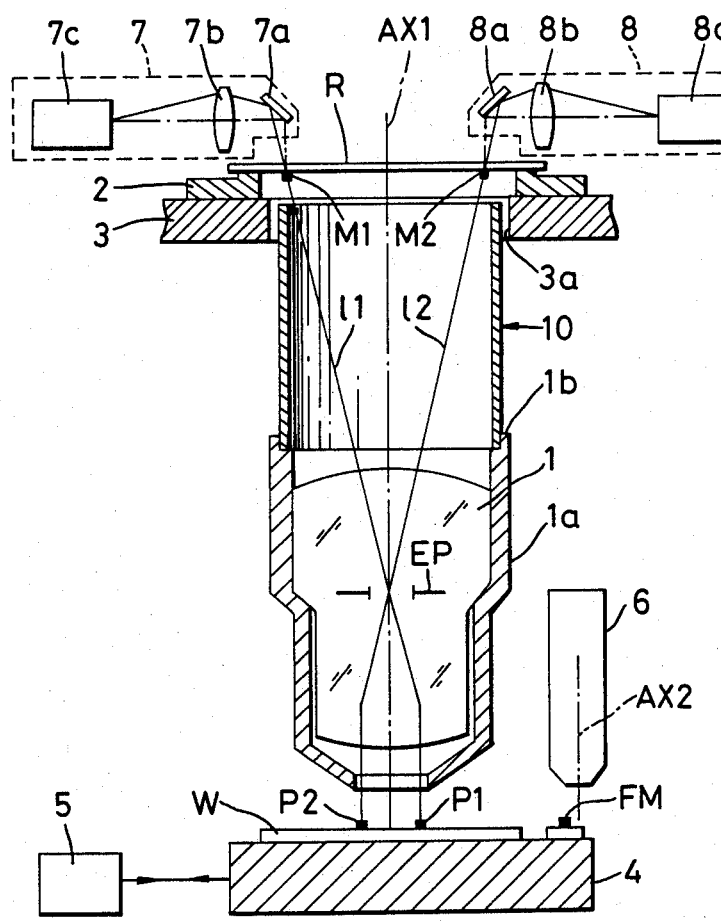

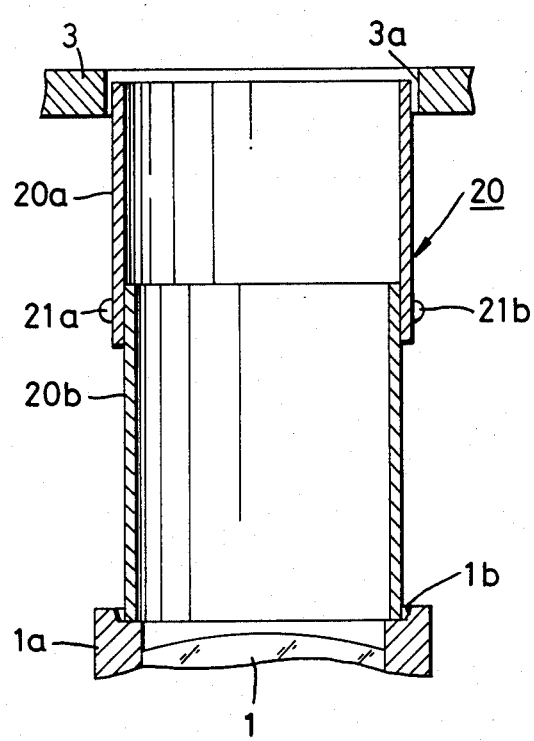

AIR FLOW SHIELDING ATTACHMENT FOR USE IN PROJECTION TYPE EXPOSURE APPARATUS

BACKGROUND OF THE INVENTION

1. Field of the Invention

The present invention relates to a projection exposure apparatus such as the photo repeater used for making working masks for use in the manufacture of semiconductor elements and the wafer stepper used for the exposure of semiconductor wafers. More specifically, the present invention is directed to a reducing projection type exposure apparatus particularly useful as the wafer stepper.

2. Related Background Art

In these years, many reducing projection type exposure apparatus, called a stepper, have been used in the manufacturing line of semiconductor elements.

The stepper is an optical apparatus for exposing a light image of a circuit pattern described is a reticle or a photomask on a wafer through a reducing projection lens at a reduction of 1/5 or 1/10.

In the stepper, the size of the area on which a pattern is copied by one shot of exposure is determined by the size of the image field of the projection lens. Usually the exposure area size is smaller than the whole surface area of a wafer. Therefore, the wafer stage having a wafer thereon is moved stepwise after every exposure so that the next exposure may be made on the next area of the same wafer. This operation is repeated for the same wafer a number of times. This projection exposure method is known as the step and repeat method.

As one of the methods for the alignment of wafer with a reticle, there has been known and used the so-called off axis alignment method. According to the method, a wafer alignment microscope is provided at a position a certain distance spaced from the optical axis of the projection lens. Using the wafer alignment microscope, one detects an alignment mark on the wafer. After the detection, one moves the wafer stage, which can move two-dimensionally, to the position in which an arbitrary exposure area on the wafer gets in alignment with the pattern image of the reticle formed by the projection lens. This positioning of the wafer stage is carried out, using the position of the wafer in which the above alignment mark has been detected, as the base position. After positioning the wafer stage, one carries out an exposure.

The thing essential for high accurate positioning of the wafer stage is precisely detect the distance conventionally called the "base line measure value". The term "base line measure value" means the distance between the reference point projection position (the position at which the reference point on the reticle is projected) and the mark detection center position (the position of the optical axis of the wafer alignment microscope).

To measure the base line measure value, a fiducial mark is provided on the wafer stage. Also, measuring means for detecting the position of the wafer stage, for example, a pair of laser interferometers are provided. The base line measure value is measured using the fiducial mark and the laser interferometers.

I, the inventor of the present invention, have conducted various experiments trying to improve the accuracy of the above measurement. These experiments have led me to the finding that the fluctuation of air around the apparatus is one of the causes for reduction of accuracy in the above measurement of the base line measure value.

The reduction of measurement accuracy has been significant in particular when the space between reticle and projection lens is open and the external air is allowed to free flow in and out across the space. It has been found that in such a construction of projection exposure apparatus, a slight shift of image is caused by the fluctuation of the air in the space and that the magnitude of the image shift is very small but may be sufficient to degrade the measurement accuracy. The image shift caused by the fluctuation of air takes place at random in direction as well as in magnitude. Therefore, it is highly possible that a large image shift is caused just at the time of measuring the base line measure amount. In this case, the image shift will be incorporated into the measured value as an error. As a result, the accuracy of registration of pattern image with wafer exposure area at the time of exposure is decreased to the extent corresponding to the image shift. Of course, such a fluctuation of air occurs also during a real exposure. In this case, the projected image is shifted on the wafer, and even a slight shift may reduce the resolution of fineness of the pattern formed on the wafer.

In order to improve the accuracy of measurement in the projection exposure apparatus, these drawbacks must be overcome at first.

SUMMARY OF THE INVENTION

Accordingly, an object of the present invention is to provide a projection exposure apparatus which is almost free from the above-mentioned error caused by the fluctuation of air in measuring the base line measure value and in which an improved accuracy of alignment can be attained for exposure with registration and for other purposes.

According to the present invention, the above object has been attained by providing an air flow shielding attatchment comprising a tubular baffle wall surrounding the projection light path between the reticle or photo-mask and the projection optical system. The baffle wall shuts out the external air flowing to the space between the projection optical system and the reticle.

Therefore, in the apparatus according to the invention, the error in measuring the base line measure value is minimized and the exposure can be performed with the projection pattern and the exposure area being more accurately registered. Furthermore, since there is no fluctuation of air in the space, the projection position of the exposed image such as a circuit pattern can not be disturbed even when the one shot exposure time (usually shorter than a second) is very short. Therefore, the resolution of the projected image on the wafer is stable for every shot. As another effect, the baffle wall prevents stray light from entering the projection optical system.

Further objects, features and advantages of the invention will appear more fully from the following description.

BRIEF DESCRIPTION OF THE DRAWINGS

FIG. 1 schematically shows the construction of a projection type exposure apparatus according to a first embodiment of the invention; and FIG. 2 is a sectional view of a part of a projection type exposure apparatus according to a second embodiment of the invention, showing another form of the baffle wall member different from that of the first embodiment.

DESCRIPTION OF PREFERRED EMBODIMENTS

Referring first to FIG. 1, there is shown a reduction projection type exposure apparatus (hereinafter referred to as the stepper) as a first embodiment of the invention.

In the stepper, images of a circuit pattern and alignment marks $M_1$, $M_2$ on a reticle R are projected, in a reduced size, on a photosensitive substrate, namely, a wafer W through a projection lens 1. The reticle R is on a reticle stage 2 which holds the article at its edges by vacuum suction. The reticle stage 2 is mounted or supported on a column 3 for two-dimensional movement. At the initial setting step during which the reticle R is positioned in a determined position, the reticle stage is moved and after the completion of the positioning the reticle stage is fixed in the position by vacuum suction.

Similarly, the wafer W is fixed on a wafer stage 4 by vacuum suction. The wafer stage 4 also is two-dimensionally movable and has a fiducial mark FM formed thereon. The fiducial mark is used for the measurement of base line measure value etc. The two-dimensional position of the wafer stage 4 is detected by a laser interferometer 5.

$AX_1$ denotes the optical axis of the projection lens 1. Spaced a certain distance from the optical axis $AX_1$ a wafer alignment microscope 6 is provided with its optical axis $AX_2$ parallel to the optical axis $AX_1$ of the projection lens 1. This wafer alignment microscope 6 is used for off-axis alignment. It can detect an alignment mark (not shown) formed on the wafer or the fiducial mark FM on the wafer stage.

The alignment of the reticle R is carried out with the aid of a reticle alignment microscope 7. This reticle alignment microscope detects the mark $M_1$ near the circuit pattern area on the reticle R. To this end, the reticle alignment microscope 7 comprises a mirror 7a, an objective 7b and a photo-electric sensor 7c. This microscope can detect any deviation of the mark $M_1$ from a predetermined detection center.

The reticle alignment microscope 7 is so disposed that its principal ray $l_1$ can pass through the center of the entrance pupil of the projection lens 1.

A step alignment microscope 8 is provided to help in direct alignment between reticle R and wafer W through the projection lens 1. This step alignment microscope 8 enables one to observe the mark $M_2$ on the reticle R and a mark (not shown) on the wafer W at the same time. Like the above reticle alignment microscope 7, the step alignment microscope 8 comprises a mirror 8a, an objective 8b and a photo-electric sensor 8c. This microscope 8 can detect any deviation in position between the two marks. The step alignment microscope 8 is so disposed that its principal ray $l_2$ can pass through the center of the entrance pupil EP of the projection lens.

A tubular baffle wall member 10 is disposed surrounding the projection light path in the area from one end of the lens tube 1a of the projection lens 1 to the underside of the reticle R. The inner wall surface of the baffle wall member 10 is covered with an anti-reflection coating. The diameter of the cylindrical baffle wall member 10 is so selected that its lower end may be fitted in the stepped portion 1b of the inside of the lens tube 1a and its upper end may pass through an opening 3a formed in the column 3. As seen in FIG. 1, the upper end lies near the underside surface of the reticle R.

The upper end of the baffle wall member 10 is formed as a free end so as not to touch the column 3 or another member. The lower end of the baffle wall member is in contact with the upper end of the lens tube or barrel member 1a. The contact is kept by the weight of the baffle wall member only. It is advisable not to mechanically connect the baffle wall member with the lens tube by any fixing means such as a screw or a spring. Preferably, the baffle wall member 10 is placed on the lens tube and left alone. If the baffle wall member 10 is fixedly connected with the lens tube 1a by means of a mechanical fastening member, some distortion may be produced in the lens tube which, in turn, may deteriorate the optical properties of the projection lens 1. Therefore, it is most desirable that the baffle wall member 10 be held in the position without any touch with the column 3 and the lens tube 1a.

Usually, this kind of apparatus is used within an environment chamber in which clean and temperature-controlled air is constantly flowing. The air flows also into the apparatus to stabilize the temperature at every part of the apparatus. The purpose for which the baffle wall member 10 is provided is to shut off external air flow and prevent the rising of air fluctuation (wind or breeze) across the projection light path in the space between the reticle R and the projection lens 1. By virtue of this member, therefore, the base line measure value can be correctly measured.

The sequence of the measurement of the base line measure value is as follows:

At first, the reticle R is placed on the reticle stage 2 and fixed in the position by vacuum suction. Thereafter, the reticle stage 2 is positioned intentionally at such a position in which the reticle alignment mark $M_1$ is out of the detection field of the reticle alignment microscope 7. Then, the wafer stage 4 is positioned at a position in which the fiducial mark FM can be detected by the microscope 7 and, for example, the projection point $P_1$ of the principal ray $l_1$ and the fiducial mark FM coincide with each other.

As an image of the fiducial mark FM is obtained through the projection lens 1 and the glass surface of the reticle R, the image is aligned with microscope 7. When the alignment is obtained, the coordinate position $(X_a, Y_z)$ of the wafer stage 4 is read by the laser interferometer 5. This position $(X_0, Y_0)$ is the origin of the base line measure value. If there is no baffle wall member 10 when the origin $(X_0, Y_0)$ is being sought, the image beam of the fiducial mark FM from the lens 1 to the reticle R (more strictly, to the reticle alignment microscope 7) is shifted due to fluctuation of air, although the shift is very minute. This shift of the image beam produces an error in the position $(X_0, Y_0)$ which is to be the origin of the base line measure value.

In the above shown embodiment of the invention, however, such disturbing air fluctuation is completely shut out by the baffle wall member 10. Consequently, photo-electric signals obtained during the detection of the mark are very stable and the measured position $(X_0, Y_0)$ is highly reliable.

Subsequently to the above step, the wafer stage 4 is moved to move the fiducial mark FM away from the projection point $P_1$, And the reticle stage 2 is moved in the manner of fine adjustment to the position in which the mark $M_1$ on the reticle R can be aligned by the reticle alignment microscope 7. After that, the stage 2 is fixed on the column 3 by vacuum suction, and alignment of the reticle is completed.

At the next step, the wafer stage 4 is moved to the position in which the projection point $P_2$ conjugate with the mark $M_2$ on the reticle R gets in alignment with the fiducial mark FM. The state of alignment between the marks $M_2$ and the FM can be observed through the step alignment microscope 8. When the alignment is attained, the coordinate position $(X_s, Y_s)$ of the wafer stage 4 is read from the laser interferometer 5. Thus, the position of the step alignment microscope 8, more strictly, the base line measure value $(X_s-X_0, Y_s-Y_0)$ of the projection point $P_2$ of the mark $M_2$ can be obtained. During the finding of the position $(X_s, Y_s)$ also, thanks to the baffle wall member, there is no flowing air across the projection light path. A very accurate and reliable measured value can be obtained accordingly.

Lastly, the wafer stage 4 is moved to the position in which the fiducial mark FM gets in alignment with the wafer alignment microscope 6. When the alignment is achieved, the position $(X_w, Y_w)$ is read from the laser interferometer 5. Thus, the position of the wafer alignment microscope 6, more strictly, the base line measure value $(X_w-Y_0, Y_w-Y_0)$ of its detection center is obtained.

From the various base line measure values obtained in the above manner, step-and-respect exposure positions on the wafer W, that is, the stepping positions of the wafer stage 4, are determined. During the step of actual exposure also, the baffle wall member 10, when used, prevents the projected image of the reticle pattern from being fluctuated by breeze or flowing air. Therefore, a substantial improvement in fineness can be attained for the pattern exposed on the wafer W.

FIG. 2 shows a second embodiment of the baffle wall member according to the invention. Like reference numerals to FIG. 1 represent the same or functionally corresponding members, no further description of which will be needed.

In the first embodiment, the cylindrical baffle wall member 10 has been formed as a one-piece tubular member. In contrast, the cylindrical baffle wall member 20 shown in FIG. 2 is composed of two parts, namely, an outer tube 20a and an inner tube 20b.

The outer tube 20a is telescopically fitted on the inner tube 20b to form an extensible tube 20. Fixing the outer tube to the inner tube can be made by means of small set screws 21a and 21b.

As the baffle wall member 20 is extensible, it can be mounted even to any existing stepper in a semiconductor element manufacturing line now being operated.

The manner of mounting of the baffle wall member 20 is as follows:

At first, the baffle wall member 20 is placed in its contracted state on a stepped portion 1b (mounting surface) of the lens tube 1a of the projection lens 1. Then, the outer tube 20a is drawn out upwardly until the upper end of the outer tube 20a enters the opening 3a of the column 3. After the outer tube is extended to a determined position, the outer and inner tubes 20a and 20b are fastened together by screws 21a and 21b.

The baffle wall member 20 of the second embodiment has the same effects as that of the first embodiment previously shown in FIG. 1.

In the above two embodiments, there is a small gap between the baffle wall member 10, 20 and the opening 3a of the column 3 on the reticle R side. The gap may be stopped with suitable seal material such as rubber film, vinyl film etc. By doing so, it is possible to keep the projection light path from reticle R to lens 1 within an almost perfectly closed space.

Although not shown in FIG. 1, the present invention may be embodied also in apparatus provided with a laser-step-alignment optical system as disclosed, for example, in Japanese Patent Application Laid Open No. 130,742/1985 (the counterpart of which is U.S. patent application Ser. No. 681,843 filed on Dec. 14, 1984, now U.S. Pat. No. 4,677,301, issued June 30, 1987). In this alignment system, a laser light spot is formed on a wafer W through a projection lens 1 and a mark on the wafer W is detected by use of the laser light spot. Even for such type of stepper, according to the present invention, the same degree of improvement as in the above-embodiments may be obtained in respect of measurement accuracy of the base line measure value by the light spot.

The use of the cylindrical baffle wall member as the first or the second embodiment according to the present invention brings about no adverse effect on the optical performance of the projection optical system. This is because the baffle wall member is merely placed on the upper end of the lens tube of the projection optical system without being connected with the lens tube mechanically such as by means of screw.

I claim:

1. In a projection type exposure apparatus having a projection optical system for projecting an image of an original pattern on a mask onto a substrate, a stage member for supporting said mask and a barrel member for holding said optical system between said mask and said substrate, wherein a light path exposed to external air is defined between said stage member and said barrel member, an air flow shielding attachment for shielding said light path from the external air flow comprising:

a tubular member having a length corresponding substantially to the distance between said stage member and said barrel member, and having cross-dimensions sufficient to envelop said light path; and means for detachably positioning said tubular member between said stage member and said barrel member such that said light path is enveloped by said tubular member.

2. An air flow shielding attachment according to claim 1, wherein said means includes a mounting surface formed on an end of said barrel member opposed to said stage member and an end of said tubular member mounted on said mounting surface.

3. An air flow shielding attachment according to claim 2, wherein said tubular member is positioned between said stage member and said barrel member merely by having the weight of said tubular member supported on said barrel member without fixation of said tubular member to said barrel member.

4. An air flow shielding attachment according to claim 3, wherein said stage member is supported for movement relative to said barrel member, and wherein the end of said tubular member opposite to the end thereof mounted on said mounting surface of said barrel member is adjacent to, but free of, said stage member.

5. An air flow shielding attachment according to claim 4, wherein said stage member is mounted on a column having an opening into which said opposite end of said tubular member is inserted.

6. An air flow shielding attachment according to claim 1, wherein said stage member is supported for transverse movement with respect to said barrel member and said tubular member.

7. An air flow shielding attachment according to claim 1, wherein said tubular member includes a plurality of tubes axially slidably connected with each other and connecting means for connecting said tubes together to set the length of said tubular member.

* * * * *